United States Patent
Lunt et al.

(10) Patent No.: US 11,287,162 B2
(45) Date of Patent: Mar. 29, 2022

(54) SOLAR POWER SYSTEM USING LUMINESCENT PAINT

(71) Applicant: GlowShop, LLC, East Lansing, MI (US)

(72) Inventors: Richard Royal Lunt, Williamston, MI (US); Alexander Grady Renny, Detroit, MI (US); Yunhua Ding, Bloomington, IN (US)

(73) Assignee: GlowShop, LLC, East Lansing, MI (US)

( * ) Notice: Subject to any disclaimer, the term of this patent is extended or adjusted under 35 U.S.C. 154(b) by 86 days.

(21) Appl. No.: 16/257,323

(22) Filed: Jan. 25, 2019

(65) Prior Publication Data
US 2019/0226720 A1    Jul. 25, 2019

Related U.S. Application Data

(60) Provisional application No. 62/621,768, filed on Jan. 25, 2018.

(51) Int. Cl.
*F24S 23/00* (2018.01)
*H01L 31/054* (2014.01)
*H01L 31/055* (2014.01)
*G02B 6/122* (2006.01)
*F21V 8/00* (2006.01)
*G02B 6/42* (2006.01)

(52) U.S. Cl.
CPC ............ *F24S 23/12* (2018.05); *G02B 6/1221* (2013.01); *H01L 31/055* (2013.01); *H01L 31/0547* (2014.12); *G02B 6/0003* (2013.01); *G02B 6/4298* (2013.01)

(58) Field of Classification Search
CPC ..... H01L 31/0547; H01L 31/055; F24S 23/12
See application file for complete search history.

(56) References Cited

U.S. PATENT DOCUMENTS

| | | |
|---|---|---|
| 2002/0165294 A1 | 11/2002 | Cooper et al. |
| 2010/0055650 A1 | 3/2010 | Bridges |
| 2011/0226996 A1 | 9/2011 | Postma |
| 2012/0024345 A1* | 2/2012 | Reisfeld .............. H01L 31/0547 136/247 |

(Continued)

OTHER PUBLICATIONS

Kang et al., "Highly photostable rylene-encapsulated polymeric nanoparticles for fluorescent labeling in biological system", 2019, Journal of Industrial and Engineering Chemistry, 80, pp. 239-246. (Year: 2019).*

(Continued)

*Primary Examiner* — Daniel P Malley, Jr.
(74) *Attorney, Agent, or Firm* — Mikhail Murshak

(57) ABSTRACT

An energy harvesting system is provided. The system includes a waveguide operable for trapping at least some light energy. The waveguide defines a surface and an edge. A photovoltaic cell is coupled to the surface or the edge of the waveguide. A waveguide redirecting material is provided on the surface of the waveguide. The waveguide redirecting material is formed of a solidified colored luminescent paint. The paint is configured to be applied and adhere to the surface of the waveguide and redirect light energy to the photovoltaic cell. A method of generating and demonstrating solar power using the system is also provided.

20 Claims, 12 Drawing Sheets

(56) References Cited

U.S. PATENT DOCUMENTS

| | | | | |
|---|---|---|---|---|
| 2012/0038841 | A1* | 2/2012 | Taheri | G02F 1/13306 349/25 |
| 2012/0118381 | A1* | 5/2012 | Debije | H01L 31/054 136/259 |
| 2012/0138144 | A1* | 6/2012 | Maeda | H01L 31/055 136/257 |
| 2014/0159636 | A1* | 6/2014 | Yang | H02J 7/00 320/101 |

OTHER PUBLICATIONS

Near-Infrared Harvesting Transparent Luminescent Solar Concentrators; Zhao et al.; Adv. Optical Mater. 2014, 2, 606-611.

Luminescent Solar Concentrator Paintings: Connecting Art and Energy; Renny et al., J. Chem. Educ. 2018, 95, 1161-1166; Jul. 2018.

Transparent, near-infrared organic photovoltaic solar cells for window and energy-scavenging applications; Appl. Phys. Lett. 98, 113305 (2011); Lunt et al.

Visual performance of red luminescent solar concentrating windowsin an office environment; Energy and Buildings 113 (2016) 123-132; Vossen et al.

High-Efficiency Organic Solar Concentrators for Photovoltaics; Science 321 (5886), 226-228 (2008); Currie et al.

Gaining Hands-On Experience with Solid-State Photovoltaics through Constructing a Novel n-Si/CuS Solar Cell; J. Chem. Educ. 2017, 94, 476-479; Jin et al.

Luminescent greenhouse collector for solar radiation; Weber et al., Oct. 1976 / vol. 15, No. 10 / Applied Optics 2299.

Luminescent solar concentrators. 1: Theory of operation and techniques for performance evaluation; Batchelder et al. Applied Optics /vol. 18, No. 18/Sep. 15, 1979.

Thirty Years of Luminescent Solar Concentrator Research: Solar Energy for the Built Environment' Debije et al.; Adv. Energy Mater. 2012, 2, 12-35; Published online: Dec. 12, 2011 www.advenergymat.de.

Energy Transfer between Dyes A Study Using Fluorescence Quenching and Forster Theory; Goodall et al.; Journal of Chemical Education vol. 62 No. 8 Aug. 1985.

Laser-Induced Fluorescence of Lightsticks; Journal of Chemical Education vol. 76 No. 1, Jan. 1999; Salter et al.

Classroom Demonstrations of Concepts in Molecular Fluorescence; Blitz et al.; Journal of Chemical Education; vol. 83 No. May 5, 2006; www.JCE.DivCHED.org.

Music Generated by a Zn/Cu Electrochemical Cell, a Lemon Cell, and a Solar Cell: A Demonstration for General Chemistry; Susan G. Cady; J. Chem. Educ. 2014, 91, 1675-1678.

A Simple Photocell To Demonstrate Solar Energy Using Benign Household Ingredients; Smith et al.; J. Chem. Educ. 2013, 90, 1358-1361.

Adjusted Colorful Amorphous Slicon Thin Film Solar Cells by a Multilayer Film Design; Yang et al.; Journal of The Electrochemical Society, 158 (9) H851-H853 (2011).

Highly efficient large-area colourless luminescent solar concentrators using heavy-metal-free colloidal quantum dots; Meinardi et al.; Nature Nanotechnology, vol. 10, Oct. 2015, www.nature.com/naturenanotechnology.

A luminescent solar concentrator with 7.1% power conversion efficiency; phys. stat. sol. (RRL) 2, No. 6, 257-259 (2008); Slooff et al.

Limits of Visibly Transparent Luminescent Solar Concentrators; Yang et al.; Adv. Optical Mater. 2017, 5, 1600851.

Transparent Luminescent Solar Concentrators for Large-Area Solar Windows Enabled by Massive Stokes-Shift Nanocluster Phosphors; Zhao et al.; Adv. Energy Mater. 2013, 3, 1143-1148.

\* cited by examiner

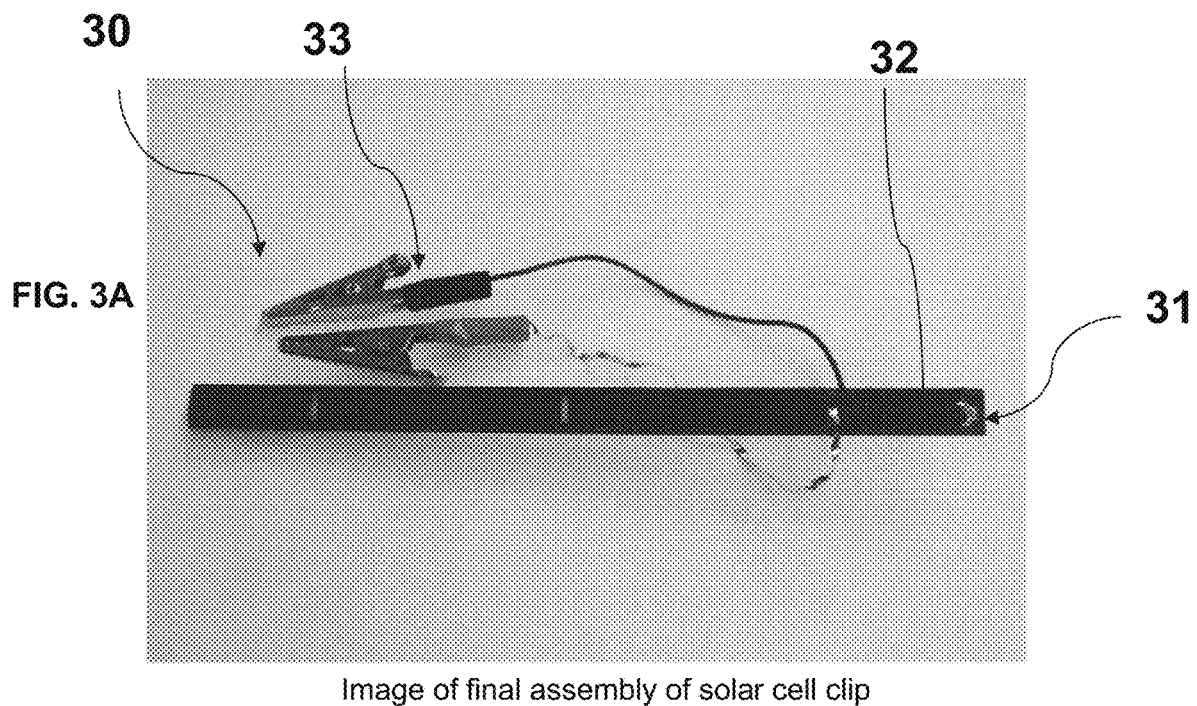
Image of final assembly of solar cell clip
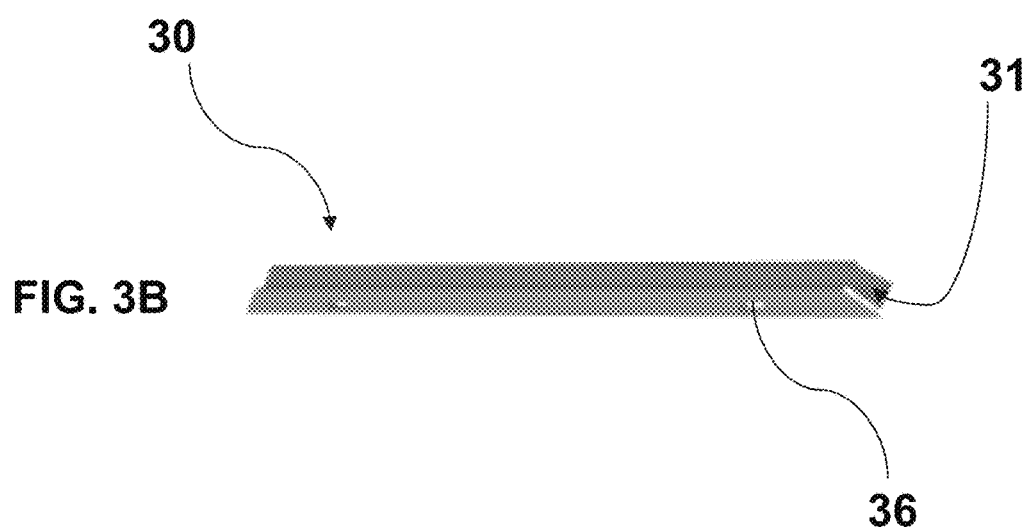

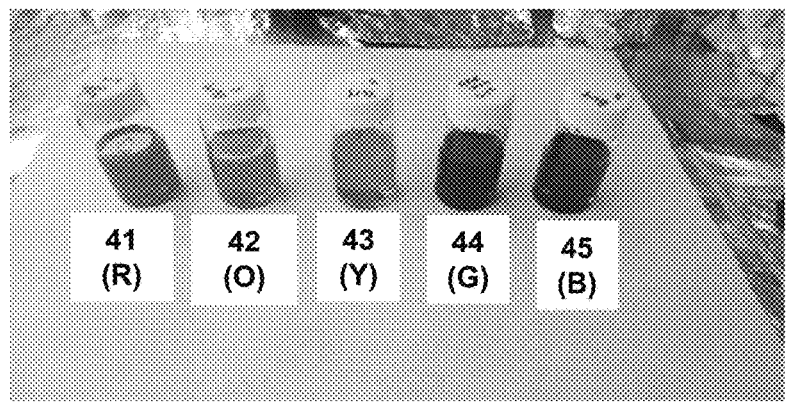

FIG. 4A

Advanced Luminescent Based Paints

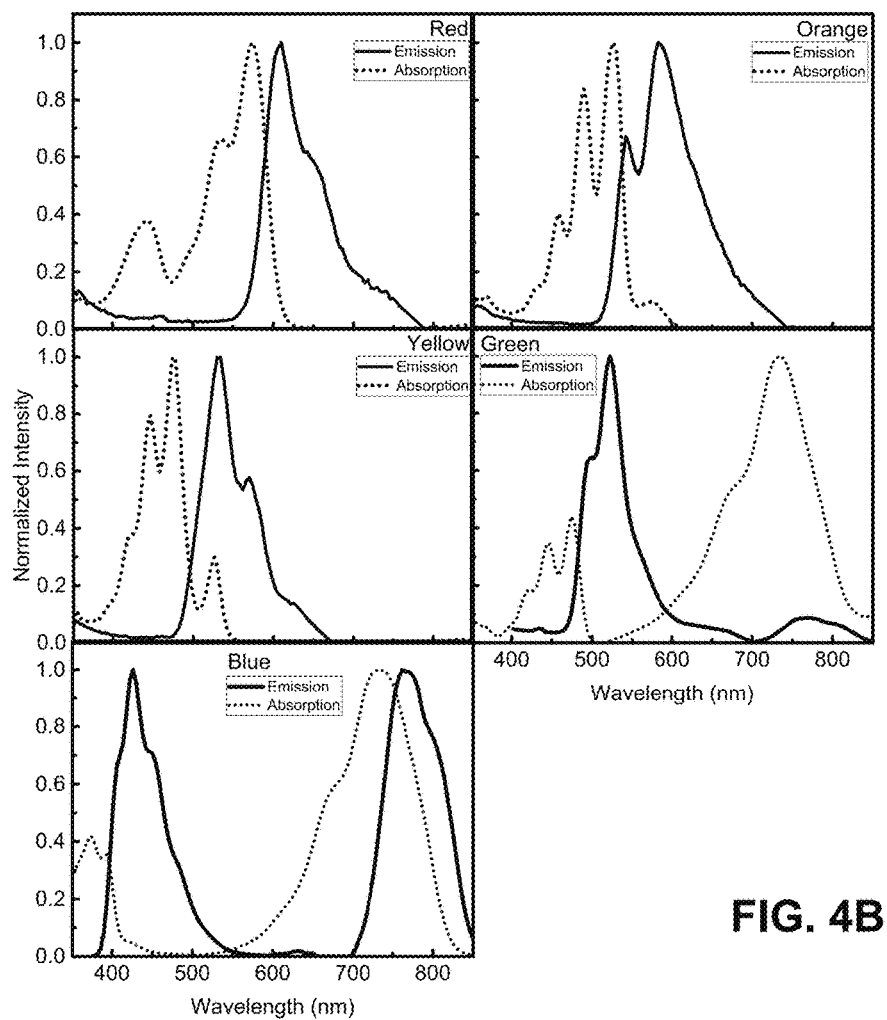

FIG. 4B

Figure 4B shows a Normalized absorption (solid, A) and emission (dotted, A) spectra of paints used. Note that the multiple absorption and emission peaks for blue and green paints stem from two distinct dyes with one dye emitting in the visible and one emitting in the infrared to reinforce absorptive coloring and provide greater power.

Regular Luminescent Based Paints 51 (B)   52 (G)   53 (Y)   54 (O)   55 (R)

Spectrum of sunlight, LED lamp, and fluorescent lamp

SOLAR POWER SYSTEM USING LUMINESCENT PAINT

CROSS REFERENCE TO RELATED APPLICATION

Priority is claimed to U.S. Provisional Application No. 62/621,768 filed Jan. 25, 2018, which is incorporated herein by reference in its entirety.

TECHNICAL FIELD

The present disclosure relates generally to the field of solar power and specifically a system and method of generating solar power through luminescent paint and teaching concepts.

DESCRIPTION OF RELATED ART

With increasing greenhouse gas emissions, electricity costs, and international agreements on combatting climate change, the need for access to inexpensive renewable energy is increasing every year. Globally, 21.6 trillion kWh of electricity were generated in 2012 and this value is projected to increase to 36.5 trillion kWh by 2040. Increasing the fraction of this energy which comes from renewable sources is necessary for securing the energy future of the world and limiting the negative environmental impact in meeting that energy demand.

The single largest source of renewable energy generation is the sun, which provides enough energy to power the planet for an entire year in less than one hour. A key to effectively harnessing this energy lies in finding ways to creatively and synergistically deploy various solar technologies across a wide variety of spaces and we aim to promote this kind of creative thinking.

While solar panels are becoming a more ubiquitous and publicly recognizable form of solar harvesting, current photovoltaic (PV) technologies are often prohibitively expensive in relation to savings available and can be constrained in application areas due to bulkiness, flexibility, or aesthetics. Thin film silicon (Si) cells, transparent organic PV, and luminescent solar concentrators (LSC) are all technologies which seek to address one or more of these issues.

U.S. Patent Application No. 2002/0165294 to Cooper et al., ("LUMINESCENT COATING"), discloses a method of detecting the quality or damage and/or deterioration of a coating when applied to a clean surface. The coating consisting essentially of a paint into which is mixed a luminescent pigment additive which is less than 10% by weight. The luminescent additive is less than that used for known luminescent paints where the level of luminescent pigment is as much as 45%. The coating is illuminated by means of a projector with ultraviolet light and then being viewed for gaps or variations in the intensity of the luminescence of the image. The image is then preferably digitally recorded for detailed analysis and subsequent reference. The coating and method are used on surfaces which are difficult to view, such as ships' ballast tanks or tall structures such as bridges.

U.S. Patent Application No. 2010/0055065 to Bridges, ("TEACHING MODEL, METHOD OF USE, AND A KIT THEREFOR"), discloses a teaching model that use luminescent paint to paint inscriptions on the surface of the model which can be read by using black light. By use of the model so modified, the model can be used as a teaching tool in an educational instruction method in which the kinesthetic multiple intelligence of the student is enhanced since the student is in control of the timing of the feedback from the model.

U.S. Patent Application No. 2010/0055065 to Bridges, ("LUMINESCENT PAINTS AND METHODS OF MAKING THE SAME"), discloses Luminescent paints and methods of making luminescent paints. In some examples, the luminescent paints may include urethane resin and luminescent substance. The luminescent paints may also include a variety of day time, UV stable colors and a flex agent that facilitates dependable application of the luminescent paint to flexible objects.

SUMMARY

The present disclosure provides for an energy harvesting system including: (a) a waveguide operable for trapping at least some light energy, the waveguide defining a surface and an edge; (b) a photovoltaic cell coupled to the surface or the edge of the waveguide; and (c) a waveguide redirecting material provided on the surface of the waveguide. The waveguide redirecting material is formed of a solidified colored luminescent paint and is configured to be applied and adhere to the surface of the waveguide and redirect light energy to the photovoltaic cell. In an example, the waveguide is formed of a polymer, for example a poly(methyl methacrylate) (PMMA) material, defining a thickness and is transparent prior to application of any waveguide redirecting material. In one example, the waveguide can define a rectangular cross section forming four edges.

In another example, the luminescent paint can define a color selected from the group consisting of red, green, blue, yellow, orange, indigo, violet, and combinations thereof. Each color can include reinforced coloring from both absorption and luminescence sources. The luminescent paint can include pigment having at least one luminescent pigment. In a further example, the pigment only includes luminescent pigment. The luminescent paint can further include a second luminescent pigment. In yet another example, the at least one luminescent pigment imparts a predominate color through luminescence and the second luminescent pigment imparts an absorptive color. In an even further example, the at least one luminescent pigment can include a perylene derivative, porphyrin derivative, or anthracene derivative luminescent dye.

The luminescent paint can include a polymer host including at least one of acrylic, poly(methyl methacrylate), polydimethylsiloxane, a derivative of acrylic, poly(methyl methacrylate), polydimethylsiloxane, and combinations thereof. In one form, the luminescent paint includes additional modifying nanoparticles or micro particles to modify the opacity of the luminescent paint from 0 to 100%. In another form, the waveguide and waveguide redirecting material are operable for generating power from a light source selected from natural solar light, artificial light, ultraviolet light and combinations thereof.

In an example, a plurality of waveguide redirecting materials are provided and include a plurality of separate colored luminescent paints. The plurality of colored luminescent paints can be selected from the group of paint colors consisting of red, yellow, blue, and combinations thereof. The blue paint can include a blue luminescent dye and a red absorbing dye with NIR luminescence, and a polymer host. In an example wherein a green paint is provided, the green paint can include a green luminescent dye and a deep red absorbing dye with NIR luminescence, and a polymer host. The red paint can include a green absorbing dye with red luminescence and a blue absorbing dye with red luminescence, and a red paint that includes a blue and green absorbing dye with red luminescence, and a polymer host. The yellow paint can include a blue absorbing dye with yellow luminescence and a green absorbing dye with yellow luminescence, and a polymer host or a yellow paint that includes a blue absorbing dye with yellow luminescence, and a polymer host, or a yellow paint that includes a blue absorbing dye with green luminescence and a green absorbing dye with yellow luminescence, and a polymer host.

In yet still another example, each paint is formed according to a process of dissolving dyes into a solvent solution and then combining with a polymer such as poly(butyl methacrylate-co-methyl methacrylate) resin based polymer matrix solution. The paint can then adhere to the waveguide and solidify. In a particular example, the solvent solution includes a member selected from the group consisting of acetone, toluene, ethyl acetate, butyl acetate, dimethylformamide, Xylene, Benzyl Alcohol, methylisobutyl ketone, cyclopentanone, dimethyl carbonate, and combinations thereof. In a further example, the paint can be applied directly to the waveguide by a technique selected from group consisting of painting, dropcasting, spray coating and combinations thereof. The waveguide redirecting material can have a luminescent efficiency of greater than 50% at at least one exciting wavelength. In an example, the efficiency is greater than about 20%, or greater than about 30%, or greater than about 40%, or greater than about 70% or greater than about 80%, or greater than above 90%.

The system of the present disclosure can have a solar photovoltaic cell that includes a material selected from the group of silicon, perovskite, GaAs photovoltaic, and combinations thereof. In an example, the system of the present disclosure can further include an array of photovoltaic cells.

The present disclosure provides for a system for demonstrating solar concepts using any of the examples previously described wherein the system is provided in an educational or classroom environment. In another example, a solar powered artwork including any of the systems previously described is provided having an artistic rendering on the surface of the waveguide using the applied waveguide redirecting material and coupled to a photovoltaic cell to generate electricity when exposed to a light source.

The present disclosure provides for a method of generating and demonstrating solar power, the method includes: (a) providing a waveguide formed of a polymer material and operable for trapping at least some light energy, the waveguide having a surface and an edge; (b) applying a waveguide redirecting material to the surface of the waveguide forming a painted waveguide, wherein the material is formed of a solidifying colored luminescent paint and the material is adapted to be applied and adhere to the surface of the waveguide and redirect light energy to the solar photovoltaic cell; (c) connecting a solar photovoltaic cell to the edge of the waveguide; and (d) exposing the painted waveguide to a light source thereby generating power through the connected solar photovoltaic cell. The method can further include illuminating the painted waveguide from different sources to demonstrate efficiency concepts. In another example, the method further includes the step of demonstrating electronic concepts by connecting a plurality of photovoltaic cells around the waveguide together in parallel or a series. The method can further include the step of generating a luminescent advertisement.

The present disclosure further provides for an educational energy harvesting kit including: (a) a waveguide formed of a polymer material and operable for trapping at least some light energy, the waveguide defining a surface and an edge; (b) a removable photovoltaic cell adapted to be coupled to a the surface or edge of the waveguide; and (c) a plurality of waveguide redirecting materials formed of a solidifying colored luminescent paint, the materials adapted to be applied and adhere to a surface of the waveguide and redirect light energy to the solar photovoltaic cell.

For purposes of summarizing the disclosure, certain aspects, advantages, and novel features of the disclosure have been described herein. It is to be understood that not necessarily all such advantages may be achieved in accordance with any one particular embodiment of the disclosure. Thus, the disclosure may be embodied or carried out in a manner that achieves or optimizes one advantage or group of advantages as taught herein without necessarily achieving other advantages as may be taught or suggested herein. The features of the disclosure which are believed to be novel are particularly pointed out and distinctly claimed in the concluding portion of the specification. These and other features, aspects, and advantages of the present disclosure will become better understood with reference to the following drawings and detailed description.

BRIEF DESCRIPTION OF THE DRAWINGS

The figures which accompany the written portion of this specification illustrate embodiments and method(s) of use for the present disclosure constructed and operative according to the teachings of the present disclosure.

FIG. 3A illustrates an example photovoltaic (PV) cell clip assembly according to the present disclosure.

FIG. 3B illustrates a clip body for use in an assembly of FIG. 3A.

FIG. 4A-4B show a plurality of advanced luminescent based paint colors and corresponding color absorption/emission spectrums.

The various embodiments of the present disclosure will hereinafter be described in conjunction with the appended drawings, wherein like designations denote like elements.

DETAILED DESCRIPTION

The present disclosure provides for a system of displaying, demonstrating, teaching, and generating solar power through a combination of the principals of fluorescence, art, solar energy harvesting, and production of solar energy devices. Combining these topics into a single system, students are engaged in the understanding of optics, waveguides, energy transport, solar energy, and the necessity of renewable energy generating devices while producing a device that can be kept as a reminder of these principles.

The present disclosure provides for a system, method, and kit for educating students about renewable and solar energy while promoting a sense of creativity often lacking in STEM demonstrations. In an example, students design luminescent solar concentrator (LSC) devices by painting, using one or more newly developed luminescent paints, onto a plastic waveguide forming an LSC painting. Thin solar cell strips are mounted around at least one edge of the waveguide to generate power. Creativity in design, a central part of scientific discovery and advancement, is promoted throughout the painting and testing of LSC painting. Accordingly, a solar module design kit for making artistic and colorful LSC paintings that generate power is provided.

Figure 1:
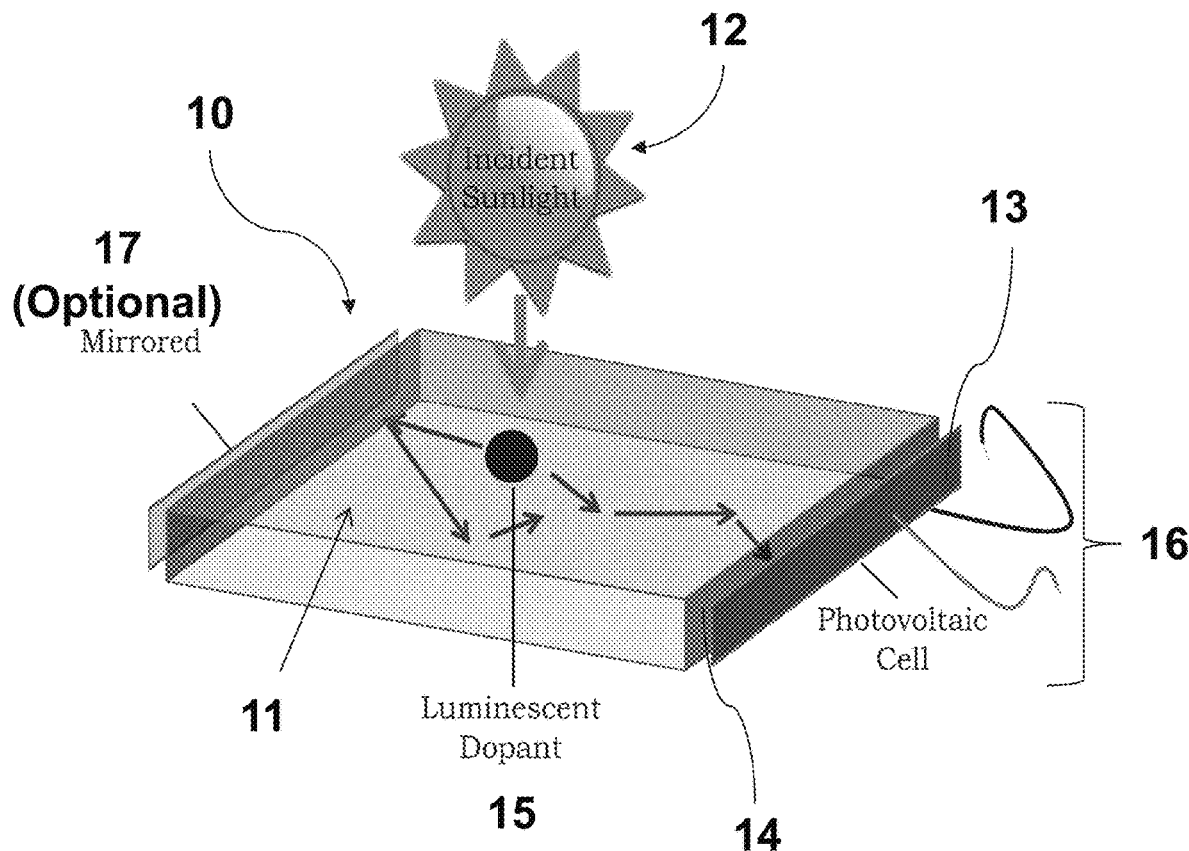
FIG. 1 illustrates a schematic and function of an existing luminescent solar concentrators (LSC).

Referring to FIG. 1, a schematic example of an LSC device 10 is shown. Device 10 includes a waveguide 11 exposed to a light source 12 (i.e., sunlight) and having at least one photovoltaic (PV) cell 13 (also referred to as a solar cell) mounted on at least one edge 14 of the waveguide 11. Waveguide 11 is made from a suitable polymer material coated or doped with a luminescent dopant 15. The PV cell 13 is coupled to a pair of electrical leads 16 for delivering electricity to another source. Optional mirrors 17 can be added to the waveguide edge. The fundamental goal of an LSC device 10 is to concentrate light gathered over a large area concentrator, such as waveguide 11 made of suitable plastic. The concentrated light is directed to a small area of at least one edge-mounted PV cell 13 to reduce the overall solar cell system cost. The PV cell 13 is typically expensive.

The waveguide 11 is doped or coated with molecules (luminescent dopant 15) which absorb certain fractions of the solar flux and re-emit this energy as luminescence at a longer wavelength (lower energy). In one example the waveguide defines a light trapping efficiency of about 50%, or 70% or more. In another example the waveguide redirecting material defines a luminescence efficiency of about 50% or more, 75% or more, 80% or more, or 90% or more. This photoluminescence is then guided by total internal reflection to edge mounted solar cells 13 for energy conversion or lost from the front/back of the waveguide 11 if emitted photons contact the waveguide surface at angles inside an escape cone. This principle is similar to that experienced at amusement parks in fiber-connected flashlights. The efficiency of trapping of the waveguide ($\eta_{WG}$, Equation 1) is dictated by the contrast in the index of refraction of the waveguide (n) and the surrounding media (air):

$$\eta_{WG} = \sqrt{\left(1 - \frac{1}{n^2}\right)} \qquad \text{Equation (1)}$$

For a typical waveguide polymer, such as poly(methyl methacrylate) (PMMA) with an index of n=1.5, this can translate to a trapping efficiency of about 75%. This means that up to about 75% of the light which is captured within the waveguide 11 can be directed to and emerge from the edges 14. Increasing total LSC efficiency ($\eta_{LSC}$) is a primary goal of current research in the field and is defined by:

$$\eta_{LSC} = (1-R) * \eta_{Abs} * \eta_{PL} * \eta_{RA} * \eta_{PV} * \eta_{WG} \qquad \text{Equation (2)}$$

This equation includes a front face reflection (R), absorptive efficiency of the luminophore ($\eta_{Abs}$), photoluminescent efficiency ($\eta_{PL}$), reabsorption suppression efficiency ($\eta_{RA}$), and photovoltaic efficiency ($\eta_{PV}$). Current LSC research goals focus on increasing the efficiencies above as well as scale of devices, flexibility, and increasing concentrator transparency. Typically, there are two goals of developing LSC technologies: 1) reduction in total PV surface area required for collecting light to reduce module costs, and 2) the ability to deploy solar harvesting devices in new areas.

LSC devices were originally developed as a simpler solution to mirror based concentrators which harvest direct-incidence sunlight. LSC devices can collect light across a wide range of incidence angles (including diffuse light), so complicated tracking equipment is not required for efficient collection of sunlight. Early concentrator designs generally absorbed and emitted light in the visible range, making them unsuitable for windows and other areas where the accurate transmission of natural light is desired. However, these visibly absorbing and/or emitting concentrators often boast much higher efficiencies than transparent LSC devices which allow for increased levels of visible light transmission. Application of both types of LSC devices into architectural spaces has become a focus of research. The application of LSC devices can also be more suited to applications where Si PVs cannot otherwise be applied. The light transmission characteristics of different devices provides architectural designers flexibility in implementation of solar harvesting technologies, from standard office windows using materials absorbing in the ultraviolet (UV) and near-infrared (NIR) portions of the solar spectrum to colorful designs which absorb in the visible portion of the spectrum. While LSC devices may not act as the sole device architecture for harvesting solar energy due to efficiency limits, they can greatly expand the total collection area for solar irradiance through implementation in spaces which are not suitable to other device architectures. The formation of visually appealing or otherwise designs which can harvest energy and demonstrate the working principles of LSC technology are achieved by the present disclosure.

The present disclosure provides for a system and method to analyze and examine LSC technology implementation which is different than uniform LSC applications seen in previous studies. In an example, absorptive and luminescent dopants are combined into a paint formulation. Incorporating absorptive and luminescent dopants into paint formulations allows painting onto sheets which constitute a waveguide of an LSC device. In one example, the waveguide sheet is optically clear. Moreover, the formation of the suitable paint formulations and the activity of painting onto the waveguide sheets results in a creative-type activity (i.e., painting) while simultaneously solving an engineering problem (i.e., solar energy harvesting). Increasing student creativity in the approach of engineering problems helps to drive innovation which enhances advances in science. Example educational objectives achieved by the system and method of the present disclosure include but are not limited to:

To engage students in discussion of renewable energy
    To highlight the energy potential from the sun
    To develop fun and instructive solar cell activities
    To associate creativity of design with STEM principles (e.g. linking art and energy)

Figure 2A:
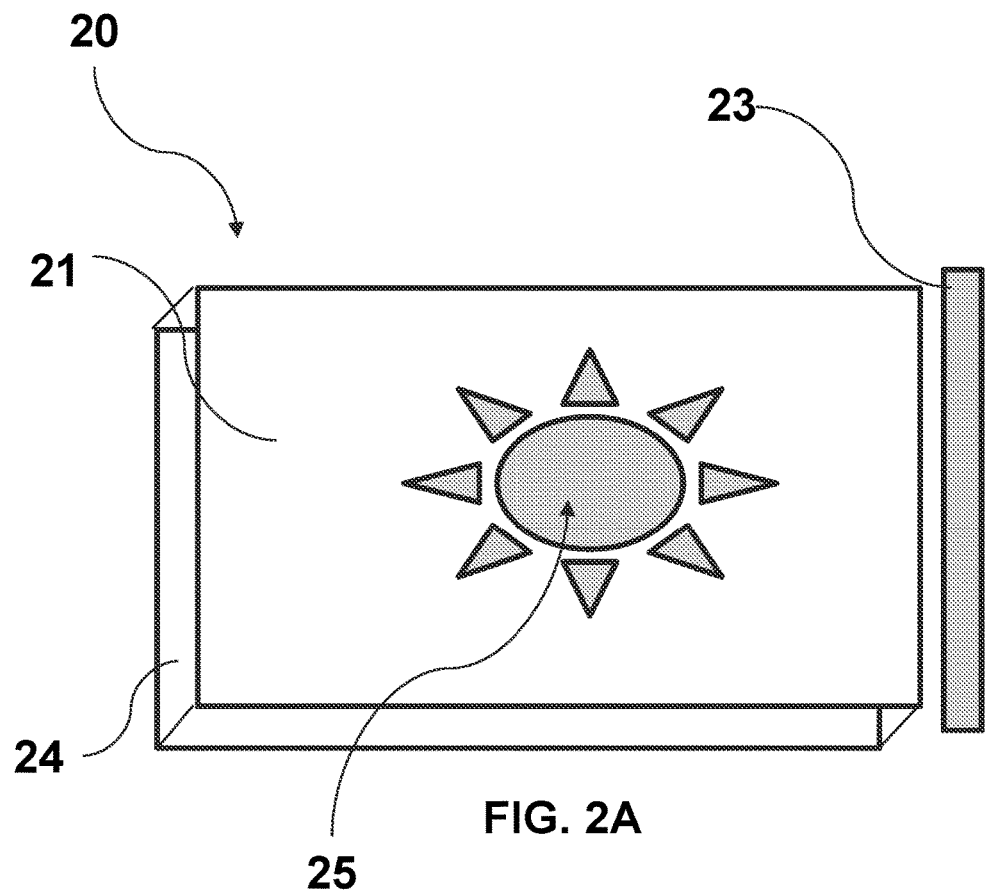
FIG. 2A illustrates a schematic of a LSC device with a painted image.
Figure 2B:
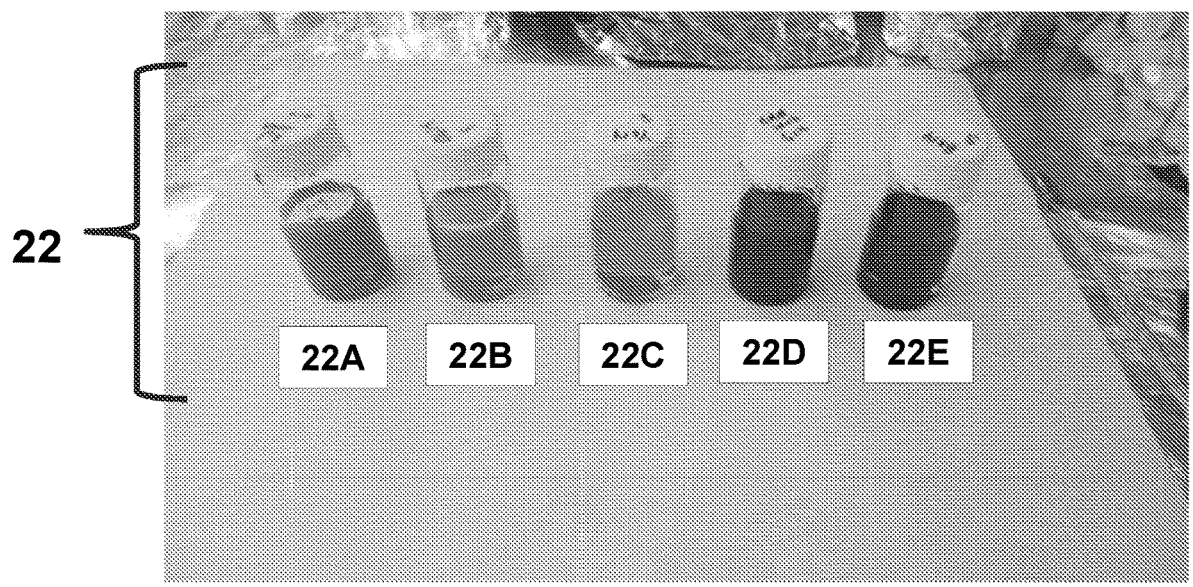
FIG. 2B shows with a variety of paints according to the present disclosure.

Referring to FIG. 2A, an example LSC device 20 according to the present disclosure includes a waveguide 21, and one or more PV cells 23. FIG. 2B shows a luminescent materials 22. In this example, the luminescent materials 22 include luminescent paints 22A, 22B, 22C, 22D, and 22E each defining a different color. In this example, paint 22A corresponds to a red luminescent paint having at least one red luminescent pigment. Paint 22B corresponds to an orange luminescent paint having at least one orange luminescent pigment. Paint 22C corresponds to a yellow luminescent paint having at least one yellow luminescent pigment. Paint 22D corresponds to a green luminescent paint having at least one green luminescent pigment. Paint 22E corresponds to a blue luminescent paint having at least one blue luminescent pigment.

In this example, a rectangular 6"×6"×¼" PMMA sheet forms waveguide 21. PMMA is used for its suitable trapping (waveguide) efficiency as well as the near complete transmission of light through the material before painting. The sheet dimensions allow for straightforward design and attachment of solar modules and forms four edges 24. While power can be generated with either flashlights or sunlight (indeed, both are encouraged), local illumination with the use of flashlights to control light penetration area and angle helps to visualize the principles of wave-guiding and can make the glowing light more apparent. Different penetration angles can also be used to promote discussion on possible efficiency loss pathways.

The luminescent materials 22 can include luminescent doped paint. The doping agent can include luminophores. In this example, five different colored paints (22A red, 22B orange, 22C yellow, 22D green, and 22E blue) were formed and used to paint a decorative image 25 onto the waveguide 21.

The present disclosure provides for paint colors suitable for purposes of providing a desirable glow property, adhering to the waveguide, and also providing light collection properties for generating solar power. An effective luminescent paint includes a paint color stemming from luminescent dyes. Paint color is determined by the absorptive, luminescent, and reflective properties of constituent dyes. Absorptive filtering allows for the transmission of certain wavelengths of light which results in visible paint coloring (the dominant mechanism). Under normal lighting conditions, the paints produce luminescence from absorbed light which also contributes to the overall perceived color by producing a noticeable glow (the second dominant mechanism of coloring). On application, a small amount of reflection from the surface of the waveguide also produces some coloring. Information on paint compositions are provided hereinbelow.

Referring to FIGS. 4A-5B, the light absorbed by luminophore (dye) molecules is emitted at a longer wavelength (lower energy) than the absorptive color of the dye. This is caused by vibrational losses of the energy of electrons in the excited state before they return to ground state. For example, a dye which has a yellow absorptive tint when in solution emits green light under excitation by flashlight; a dye which has a red absorptive tint (absorbing blue and green light) emits red light which reinforces the color. Matching paint absorption color with emission color may be desired in certain applications to amplify particular coloring. This can be achieved by mixing commercially available luminescent dyes so the imparted color from absorption and luminescence are similarly matched. The complementary blending of both the emission and absorption spectra of different dyes can be performed to produce a five-color spectrum as shown in the example of FIG. 2.

Figure 5A:
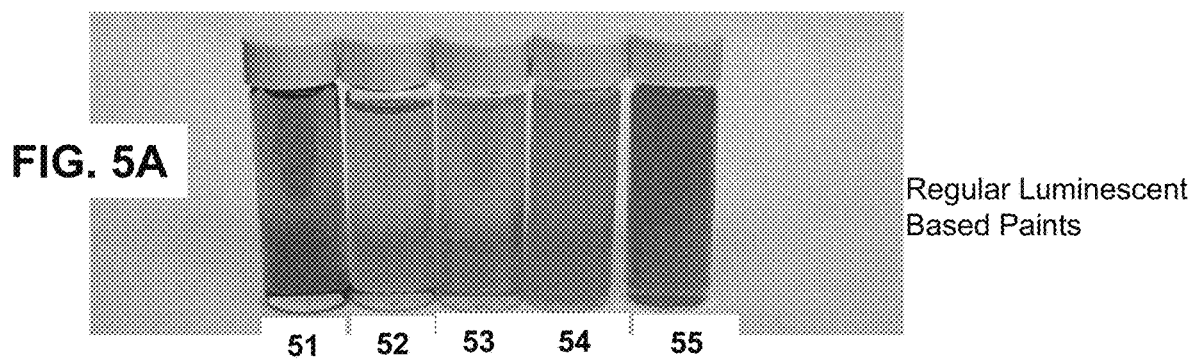
FIG. 5A-5B show a plurality of regular luminescent based paint colors and corresponding color absorption/emission spectrums.
Figure 5B:
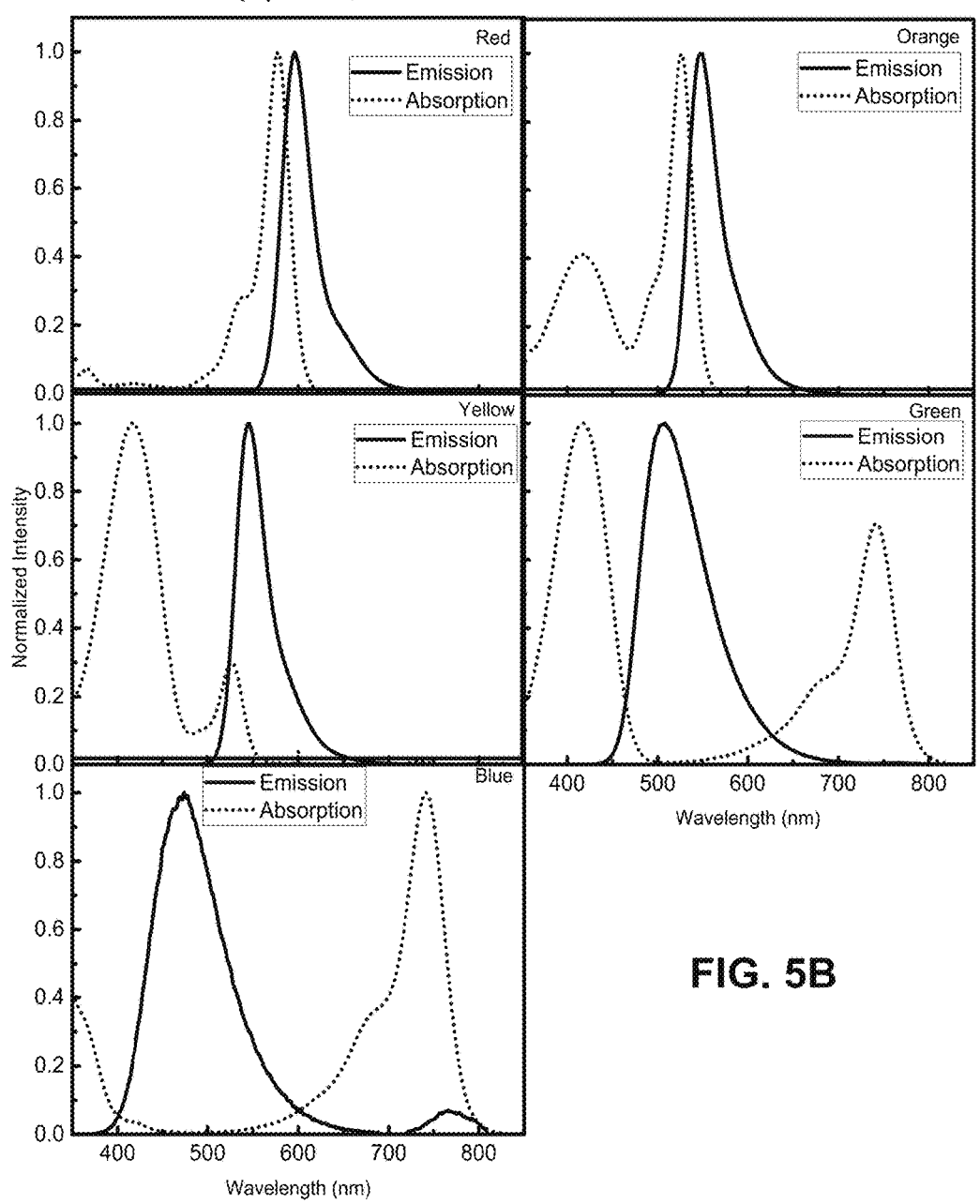
Figures 6A, 6B:
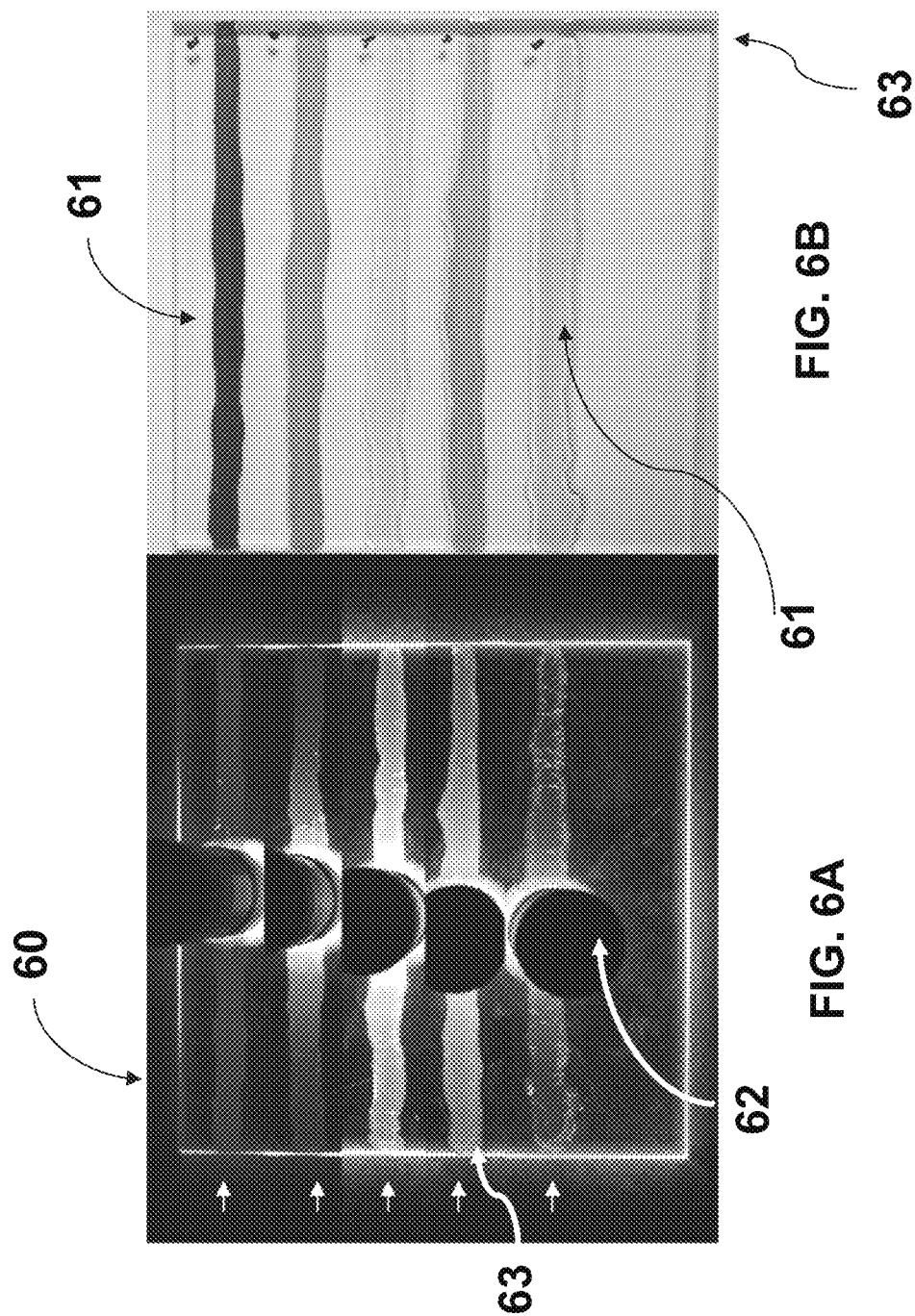
FIG. 6A-6B illustrate a painted LSC device shown in ambient (6B) and illuminated light (6A).

FIGS. 4A-4B show five colors formed having advanced luminescent dyes doped into the polymer-based paint. These colors include paint 41 for red (R), 42 for orange (O), 43 for yellow (Y), 44 for green (G), and 45 for blue (B). FIGS. 5A-5B show five colors formed having regular luminescent dyes doped into the polymer-based paint. These colors include paint 55 for red (R), 54 for orange (O), 53 for yellow (Y), 52 for green (G), and 51 for blue (B). Each of the graphs for each paint color formed as shown in FIGS. 4B and 5B show a normalized absorption (grey) and emission (black) spectra of paints used in an example demonstration. Note that the multiple absorption and emission peaks for blue and green paints stem from two distinct dyes with one dye emitting in the visible and one emitting in the infrared to reinforce absorptive coloring and provide greater power from a variety of light sources. The advanced luminescent doped paint of FIG. 4B offers a better and stronger glow and color saturation (or color coordinates) as compared to FIG. 5B. Color saturation is often described by chromaticity coordinates based on the CIE 1931, CIE 1931 RGB, CIE 1931 XYZ, CIE xy, CIE xyY, color spaces. For example, in the CIE 1931 xy chromaticy diagram, color coordinates of (0.65, 0.3) is red and (0.7, 0.25) is a deeper red; coordinates of (0.25, 0.7) is green; coordinates of (0.15, 0.1) is blue; coordinates of (0.45, 0.5) is yellow; coordinates of (0.55, 0.4) is orange; and coordinates of (0.33, 0.33) is white.

In an example, the process of producing the paints 22 include the steps of dissolving dyes into a solvent and then combining with a suitable polymer-based solution. In this example, the dyes were dissolved in an acetone solution and then combined with a poly(butyl methacrylate-co-methyl methacrylate) resin based polymer matrix solution (n=1.51) to create the final paint which can adhere to the PMMA waveguide and dry within an hour of application. In yet another example, the paints can be made to dry within 15 minutes of application. The dried paint thickness can be 0.001 mm, 0.01 mm, 0.05 mm, 0.1 mm, 0.2 mm, 0.5 mm, 1 mm, 2 mm, or 5 mm. A non-limiting list of suitable solvents include but are not limited to acetone, toluene, ethyl acetate, butyl acetate, dimethylformamide, xylene, benzyl alcohol, methylisobutyl ketone, cyclopentanone, water, or dimethyl carbonate.

In an example, the higher the luminescence quantum yield of the paint, the brighter the luminescent "glow" effect. It is preferable therefore to have the luminescence quantum yield of the entire paint composition have a quantum yield of luminescence greater than 20%, 30%, 40%, 50%, 70%, 80% or 90% for any wavelength range with substantial absorption (e.g. greater that 10% absorption) of the paint. In another example, it is preferable to have the quantum yield of luminescence for the paint at any particular exciting wavelength be greater than 50%, 70%, 80%, or 90%.

Opacity of the luminescent paint can be adjusted by including nanoparticles to adjust the opacity between 0% and 100%. Non-limiting examples of nanoparticles include $TiO_2$, $SiO_2$, ZnO, and ITO with particle diameters between 10 nm and 100 microns.

In an example of the system and method of the present disclosure, disposable pipettes were used in place of traditional paintbrushes to increase the thickness (and associated color density) of applied paints. Paint brushes can also be utilized but often require multiple coats due to dye solubility of the paints. Even if higher solubility are possible, concentrations above those utilized may lead to "concentration quenching" of the luminophore resulting in a reduction in luminescence efficiency and less glowing. Pipettes are initially less intuitive for participants to use but provide more control than brushes. It may be helpful to have participants practice controlling them with scrap pieces of acrylic before attempting more complicated patterns and paintings.

Figure 3C:
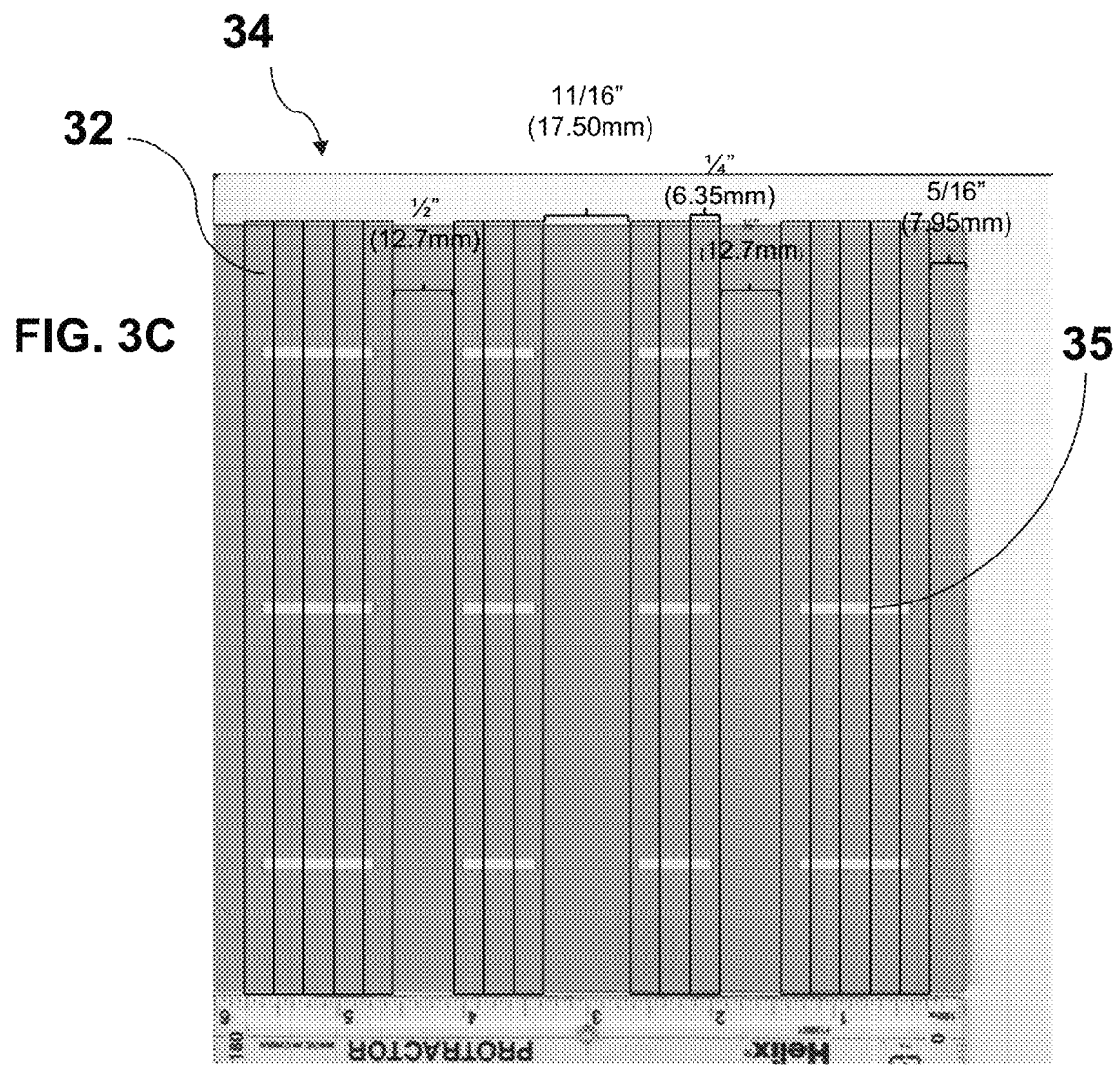
FIG. 3C illustrates a wafer of solar cells for use in a PV cell clip of FIG. 3A.

Referring to FIGS. 3A-3C, the present disclosure provides for a PV cell clip 30 operable to allow for mounting and dismounting of a fragile PV cell around an edge of a waveguide. In this example, the clip 30 was designed and 3D printed to a define an elongated body having a squared cross section with an opening on one side forming a channel and an interior portion 31 of the clip 30. A solar cell 32 is cut to a dimension sufficient to be provided within the interior portion 31. The solar cell 32 is positioned to contact the edge of the waveguide when the clip 30 is mounted onto the waveguide. Accordingly, the light energy trapped/collected by the waveguide is received by the solar cell 32. There can be 1, 2, 3, 4, 5, or 6 or more solar cells mounted around the waveguide. In this example, a laser-cut 6"×¼" silicon solar cell 32 was inserted into the printed clip 30 defining holes 36 for soldered electrical leads 33. The cell 32 was then encapsulated in a clear epoxy for durability. Producing solar modules which are durable and easy to attach is advantageous for hands-on demonstration, especially for younger participants.

As shown in FIG. 3C, individual solar cells 32 can be cut from large Silicon (Si) wafers. In this example, the solar cells 32 were cut from a 6"×6" Si wafer 34 and cut appropriately to allow for use in application—specifically, bus bars 35 are present on each of the final Si cells to be inserted into printed clips 30. This allows for insertion into solar cell clips and attachment of leads 33 to produce final solar cell modules. Depending on bus bar 35 length on a precursor wafer 34, number of final cells available per precursor wafer 34 varies. For example, the wafer 34 shown can produce 16 final Si cells 32. If bus bars 35 extend entire length of wafer 34, 24 final Si cells would be available (6" wafer, ¼ final cell width). Cutting solar cells in other directions non-parallel to the busbars leads to low charge collection efficiency and little power generation.

In an example to produce paints used in a demonstration according to the system and methods of the present disclosure, several stock solutions (SS) of luminescent dyes are prepared and then combined in the provided ratios (Table 1). All SS consist of specified dyes (below) dissolved in 20 mL of acetone Scintillation vials (20 mL) were used for all precursor solution/paint preparation. A non-limiting example of stock solution dyes are included below.

SS 1: 0.0024 g Coumarin 153; 53518-18-6
SS 2: 00020 g Rhodamine 6G; 989-38-8
SS 3: 0.0016 g HITC Perchlorate; 16595-48-5
SS 4: 0.0012 g N-[4-[4-(N-naphthalen-1-ylanilino)phenyl]phenyl]-N-phenylnaphthelen-1-amine; 123847-85-8
SS 5: 0.0015 g Rhodamine 640 Perchlorate; 72102-91-1

TABLE 1

Ratio of stock solutions to produce final paint solutions which are then combined with a mounting media to produce the final paints.

| | SS 1 | SS 2 | SS 3 | SS 4 | SS 5 |
|---|---|---|---|---|---|
| Red | | | | | 1 |
| Orange | 1 | 1 | | | |
| Yellow | 6 | 1 | | | |
| Green | 10 | | 3 | | |
| Blue | | | 2 | 5 | |

The initial dye concentration can be 0.01, 0.05, 0.10, or 0.15 mg/mL. Dyes can be selected from pophyrins, cyanines, phthalocyanines, perylenes, acenes, rhodamines, carbazoles, diamines, phenylpyridinato metal complexes (containing elements such as Ir, Pt, Pd, Au, Cu), coumarins, squaraines, napthalocyanines, derivatives thereof, and combinations thereof, After producing the given dye solution, mounting media (acrylic resin solution) is added at a 1:2, 1:1, 3:2, or 2:1 ratio to prepared solution to create the final paint. For example, 40 mL would be added to 20 mL of paint solution to produce 60 mL of paint for a 2:1 ratio. A lower amount of mounting media will result in a less viscous paint which can be difficult to control. Also, nanoparticles or microparticles of wide bandgap materials such as $TiO_2$, ZnO, ITO, $SiO_2$, can be added to the paint to modify the level opacity or haze for each color via light scattering from 0% to 100%. Typically, the addition of these particles does not significantly alter the color, rather they just alter the ability to see through the painting. Particle sizes to impart light scattering are generally on the order of the wavelength of light, e.g. between 50 nm to 1 μm.

In yet another example, to produce advanced glowing paints used in a demonstration according to the system and methods of the present disclosure, the following process can be used: To make about 2 L of a red, orange, yellow, green, or blue paint, about 1 L of acetone is added to the respective mass of solid dye required for that paint. After all dye has dissolved into acetone/dye solution, 1 L of mounting media is added to the acetone/dye solution which results in the final paint solution.

Mass of solid dyes to make 2 L (133 individual paint vials for kit) of advanced luminescent paint:
Red
   BASF Lumogen® F Red 305—1.00 grams
Red (alternate)
   BASF Lumogen® F Red 305—1.00 grams,
   $MoCl_2$ Nanoclusters or PtOEP
Orange
   BASF Lumogen® F Red 305—0.19 grams
   BASF Lumogen® F Orange 240—1.61 grams
Yellow
   BASF Lumogen® F Yellow 083—0.53 grams
   BASF Lumogen® F Orange 240—0.12 grams
Green
   BASF Lumogen® F Yellow 083—0.48 grams
   HITC Perchlorate—0.38 grams
Blue
   BASF Lumogen® F Violet 570—0.53 grams
   HITC Perchlorate—0.40 grams Paints should be stored in airtight containers in a dark area. If prepared paints are not sealed tightly, the polymer host may crosslink and the paint will solidify in the container. Scintillation vials with foil lined caps provide adequate sealing to minimize polymer host solidification. It is recommended that paints be used within several days of initial preparation to minimize degradation of the dyes and possibility of crosslinking due to faulty seals.

PMMA (acrylic) sheets used for paintings may be available and cut to size 6" by 6" by ¼ sheets. Sizes used in a demonstration need not be of these exact dimensions or even PMMA—any material with a similar index of refraction to will suffice (polycarbonate, polydimethylsiloxane, glass, etc.). Flashlights used in an activity can be typical household flashlights (visible spectrum) and inexpensive ultraviolet flashlights used for detecting counterfeit currency.

Si solar cells cut to 6" by ¼ are sufficient for use according to the system and method of the present disclosure. Si cells can also be purchased as larger cells (for example, 6" by 6") and cut via lasers, saws, etc. and snapped to size, but a risk of high failure rates can result. Care should be taken when soldering silicon cells as they are fragile. The use of a rosin pen in conjunction with tabbing wires is highly recommended for attachment of the positive and negative leads.

In place of 3D printed clips, plastic U-shaped wear strips can be modified using a sharp blade to cut openings for attachment of leads to a silicon cell to make a reusable solar cell clip similar to 3D printed clip as shown in FIG. 3B. Cells which have already been soldered can also be permanently mounted to any painting by applying a layer mounting media to the edge of the PMMA sheet to bond the face of a prepared silicon cell to that edge. This can be a preferable preparation method if is not expected that students will produce more than one painting each.

Figure 7A:
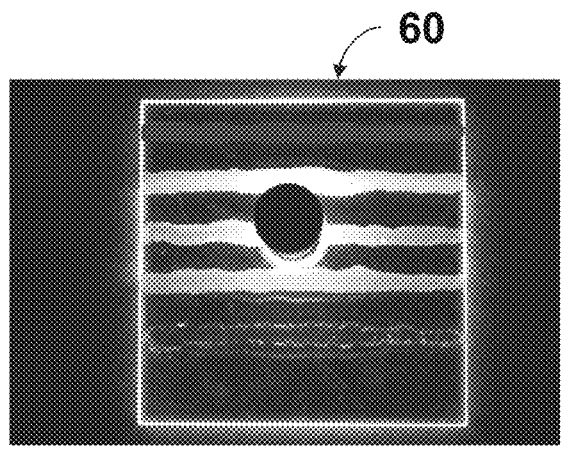
FIG. 7A-7E illustrate a plurality of LSC devices illuminated by a flashlight at different positions on the device.
Figure 7B:
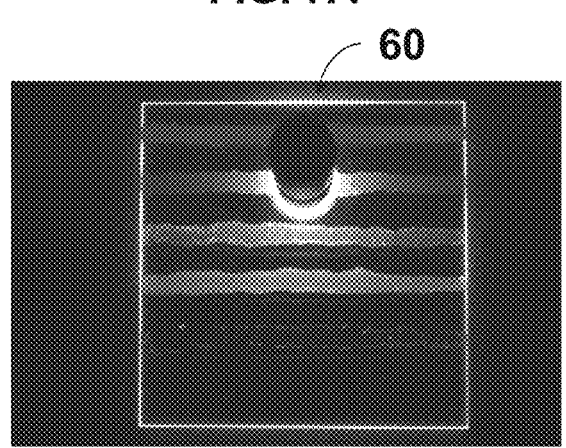
Figure 7C:
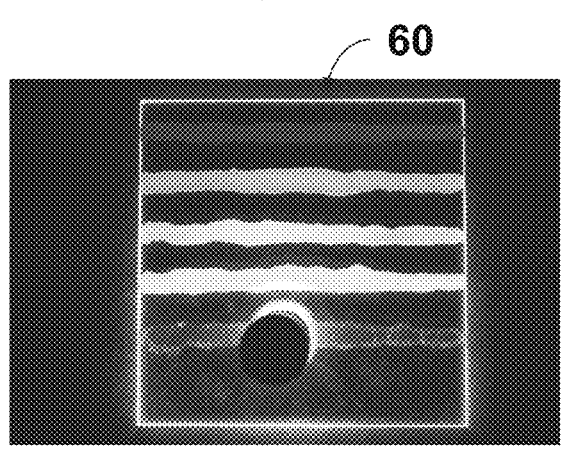
Figure 7D:
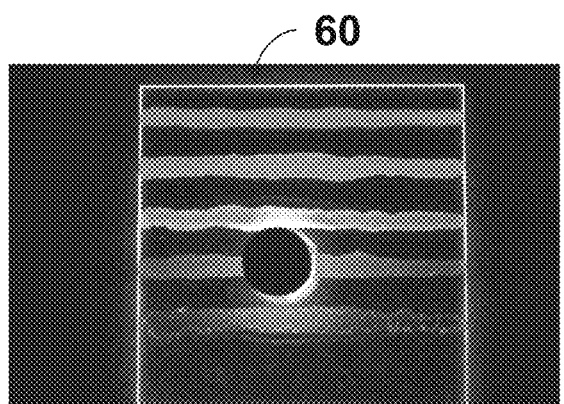
Figure 7E:
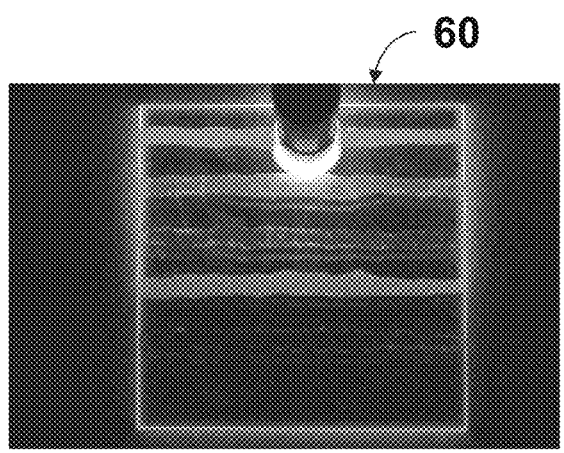
Figures 8A, 8B, 8C:
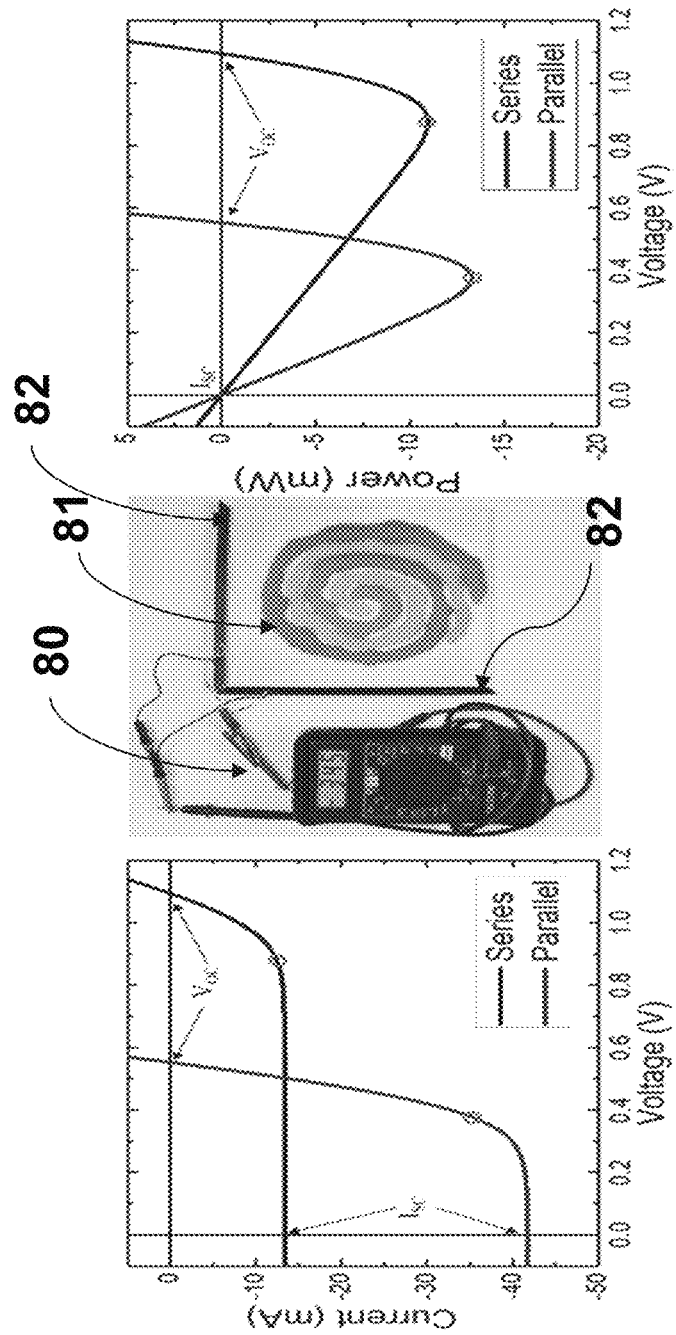
FIG. 8A-8C illustrate a painted LSC device connected to a multimeter (8B) along with current (8A) and power voltage (8C) graphs.

Referring to FIGS. 6A-6B, 7A-7E, and 8A-8C, the system and method of the present disclosure is useful in demonstrating solar power concepts and the like. FIGS. 6A and 6B and 7A-7E show a painted device 60 under direct illumination using a visible spectrum LED flashlight 62 (6A) and ambient conditions (6B). Flashlight 62 is shown positioned at different portions of the painted device thus illuminating different painted stripes 61. FIGS. 7A-7E show each of the positions of illumination of device 60 with flashlight 62 positioned in the upper middle of device 60 on the third stripe 61 from the top (FIG. 7A), towards the top on the second stripe 61 from the top (FIG. 7B), towards the bottom on the fifth painted stripe 61 from the top (FIG. 7C), on the lower middle on the fourth painted stripe 61 from the top (FIG. 7D) and at the top stripe 61 (FIG. 7E). Note luminescence along waveguide edge 63 where solar modules are attached during demonstration.

In this case, power conversion efficiency alone is not the main motivator. Rather it is a combination of power conversion efficiency and artistic nature that is the goal so that the lower efficiencies are preferable with higher degree of artistic nature. That is, lower power conversion efficiencies are not only tolerable in this application; it is encouraged for the sake of art. Nonetheless, it is optimal to have the light-harvesting and luminescence efficiency of each paint to be as high as possible so that highest conversion efficiency and highest glowing character is achieved for a particular artistic content. In an example, the demonstration is comprised of four segments: 1) painting of devices, 2) paint drying time, 3) solar cell clip attachment and 4) device testing. Upon completion of drying, solar modules are attached to one edge of each device. An electrical fan can then be connected to the painted LSC device to first get a qualitative idea of power generation by the devices before moving on to a multimeter 81 (FIG. 8B) where current and voltage could be measured.

An IV curve (FIG. 8A) from two solar cell modules 82 attached to a painted LSC 80 in either parallel or series displays possible voltage and current combinations. The short circuit current, ISC (current at zero voltage), and the open circuit voltage, VOC (voltage at zero current), are used to characterize solar harvesting devices, but operation at either of these points will not provide usable power since P=I*V. Power output is maximized at the MPP (maximum power point), which for this example was 11.0 mW (0.87V, 12.6 mA) or 13.3 mW (0.38V, 35.0 mA) for series and parallel respectively.

One question that can be raised is which paint will produce the most power. This can be examined by students on their own paintings by using a flashlight to target only a single paint/area of the painting instead of illuminating the whole collection area as under the sun as shown in FIGS. 7A-7E. While the most efficient device is not the goal of this activity, in real world applications the highest device efficiency is desired, so it is a worthwhile question to address. Photon energy (E, eV) is inversely proportional to the wavelength ($\lambda$, μm) by equation 3:

$$E = \frac{1.240 \text{ eV} * \mu m}{\lambda} \quad \text{Equation (3)}$$

Figure 9:
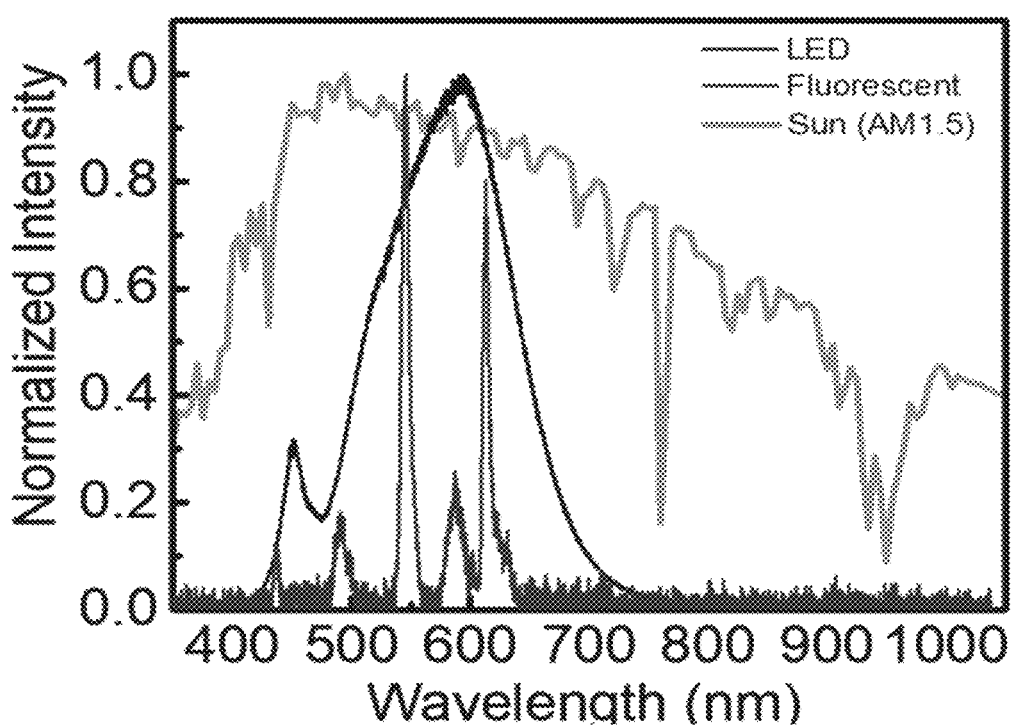
FIG. 9 illustrates a wavelength vs normalized intensity graph for sunlight, LED lamp, and fluorescent lamp.

As a result of this equation, many may initially (and intuitively) conclude that lower wavelength (higher energy) fluorescence/solar-absorption would yield higher current generation. However, the energy of the photon does not directly impact the efficiency of current generation because the excess energy of all the absorbed photons is thermalized to the bandgap and each absorbed solar photon produces, at most, one luminescence photon. This re-emitted photon can be reabsorbed, lost through the escape cone, or produce a maximum of one electron in the solar cell (in the absence of multiexciton generation). That is, the energy of the photon is not informative about the power generation in single junction LSCs. The amount of power generated depends on the overall amount of absorption within a particular wavelength range, the amount of photons in the light source at those wavelengths, the luminescence efficiency, reabsorption losses from the dyes, and the efficiency of converting particular wavelength photons into electrons in the solar cell (Equation 2). The photoluminescent efficiencies for the constituent luminescent dyes described above are all similarly high; the wavelength efficiency (or quantum efficiency) for Si PVs is relatively flat across the spectrum (500-1000 nm) except at UV and blue wavelengths where the efficiency drops off by about half; the solar photon spectrum is also relatively flat in the range of 500 nm-1000 nm (visible and infrared) as shown in FIG. 9.

The "best" color can then be attributed to the tuning of absorption widths (total light source absorption) combined with a particular pairing of light source. For example, red paint has an absorption peak of ~570 nm, a wavelength which is emitted at a much higher intensity by flashlights used in the demonstration (See FIG. 9, LED). This leads to a high current generation potential. For the blue paint, a luminophore which emits in the near-infrared and absorbs in the red is used with a visibly luminescent dye to reinforce the blue color by absorbing the ultraviolet and emitting in the blue. This causes the blue paint to absorb light at ~650-750 nm (red) and 300-400 nm (UV) and luminescence (glow) between 450-500 nm. "Reinforced coloring" is where multiple mechanisms of color formation are present. For example there are multiple routes to the creation of color: absorptive filtering, reflective coloring, luminescence coloring, and scattering coloring. A non-limiting example is combining luminescence coloring of a particular color with absorptive coloring of a similar color to enhance the overall perception of that color or color saturation and so that the color does not change (color coordinates) if one or the other of the mechanisms is diminished. For example, reinforced coloring can be accordingly created as:

Blue: Dye 1—Absorb Red and Orange, Glow near-infrared; Dye 2—Absorb ultraviolet, Glow Blue Green: Dye 1—Absorb Red, Glow near-infrared; Dye 2—Absorb Ultraviolet/Blue, Glow Green Orange: Dye 1—Absorb Blue, Glow Orange; Dye 2—Absorb Green, Glow Orange
Yellow: Dye 1—Absorb Blue, Glow Yellow; Dye 2—Absorb ultraviolet, Glow Yellow
Red: Dye 1—Absorb UV/Blue/Green, Glow Red
Or Red: Dye 1—Absorb Green, Glow Red; Dye 2—Absorb UV/Blue, Glow Red.

Most commercial fluorescent and LED lamps do not emit at all in the UV or infrared, and the combination of these factors results in a low total current generation potential by these paints under artificial illumination. The blue and green paints have a higher current generation potential under sunlight, where both UV and infrared wavelengths are present as seen in the AM1.5 spectrum (See FIG. 9). Reabsorption of the luminescence in the same or other dyes also plays a role in the overall current generation potential of a given paint.

Generation of the most power possible from a device is useful but is often secondary to producing the correct voltage and current for a particular application. This can be achieved primarily through different PV cell arrangement. Connection of multiple devices into an array as seen in large scale solar installations is carefully considered to satisfy voltage/current requirements. Similarly, connection of PV cells of the present disclosure in series and/or parallel circuits allows for tuning of voltage or current respectively to meet application requirements. An application requiring higher current levels than provided by a single device could utilize several devices with solar cell modules connected in parallel to increase output current; an application requiring higher voltage than produced by a single PV module (~0.4V for Si based LSCs) could be configured with several modules wired together in series to build voltage like batteries in series.

In the example discussed above, the DC fan required 0.3V to begin operation. Because the operating point in both series and parallel exceeds the 0.3V threshold, the fan speed is limited only by the current provided. The combination which produces the most current will then yield the fastest fan speed. Wiring the edge mounted solar cells in parallel will produce the best device in this case. However, many applications (e.g. recharging batteries) require at least 1.8V, significantly more than can be generated by two cells connected in series. Connection of several devices (e.g. four cells from the four edges) in series is then required to produce a device suitable for these applications if they are to be powered directly.

Figure 10:
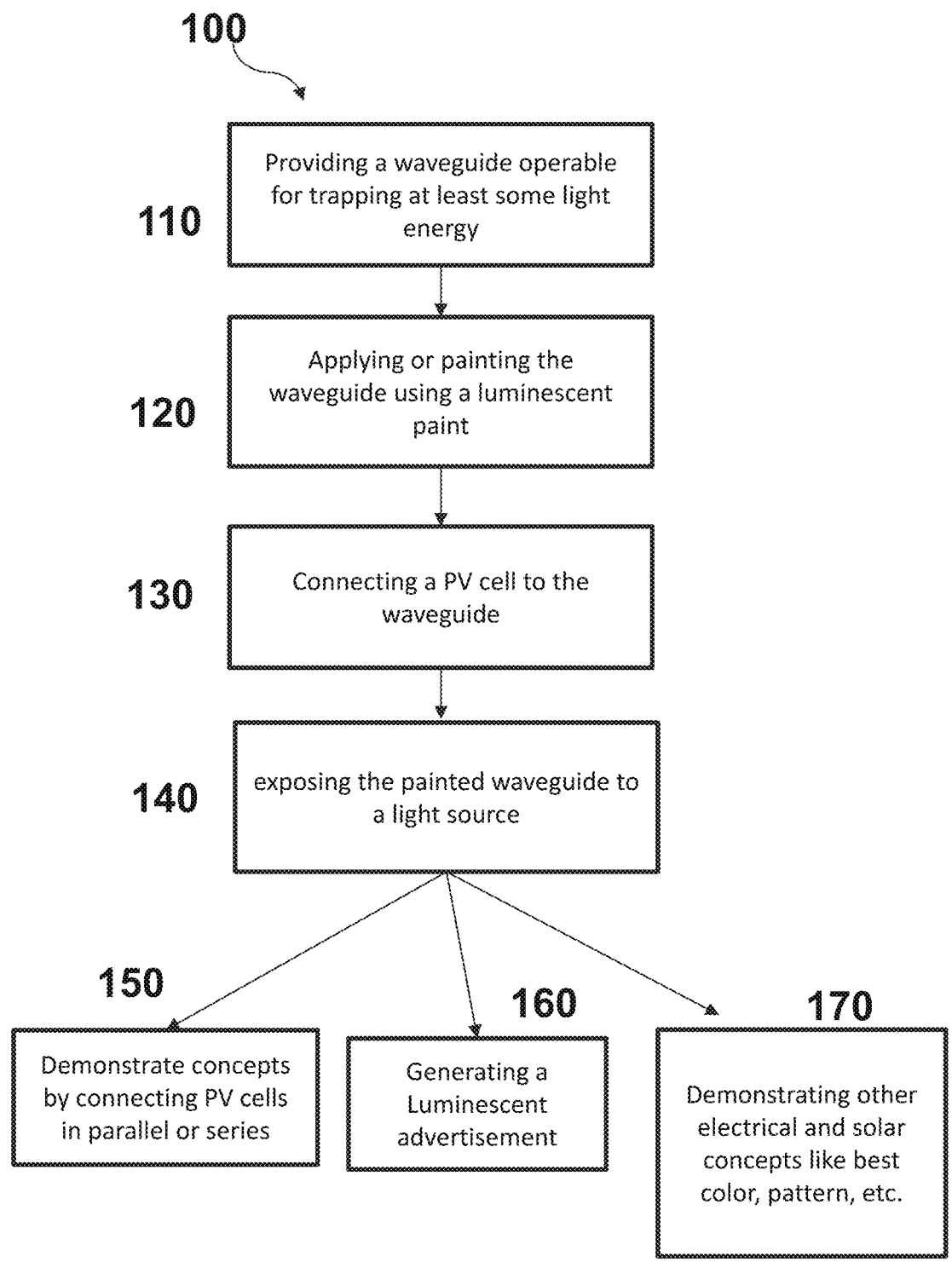
FIG. 10 illustrates a flow chart of a method for generating and demonstrating solar power associated with the present disclosure.

Referring to FIG. 10, a method 100 of generating and demonstrating solar power is shown in a flow chart. The method includes the step 110 of providing a waveguide. The waveguide is typically formed of a polymer and transparent material operable for trapping at least some light energy. The method continues to step 120 applying or painting the waveguide using a luminescent paint. The luminescent paint is a waveguide redirecting material and is applied to a surface of the waveguide forming a painted waveguide. The user can apply the paint in any fashion they wish including an artistic expression. The paint is formed of a solidifying colored luminescent paint and the material is adapted to be applied and adhere to the surface of the waveguide and can redirect light energy to a solar photovoltaic cell. The method continues to step 130 where a PV cell is connected to the waveguide. In step 140, the painted waveguide is exposed to a light source thereby generating energy. Once the energy has been generated through the painted cell, several exemplary options exist including demonstrating electrical concepts by connecting multiple PV cells to the waveguide in parallel or series as shown in box 150, generating a luminescent advertisement as shown on box 160, or demonstrating other electrical concepts and solar power concepts like determining differences among colors and positions of the light on the waveguide as shown in box 170.

One objective of the present disclosure is to engage students in discussion of renewable energy, highlight the potential from the sun, develop a fun and instructive activity, and associate creativity of design with STEM principles. Throughout the activity students are engaged in the discussion of renewable energy, from initial concepts of total available potential through to devices used in harvesting solar energy. With the use of different measuring devices, the energy potential available from the sun can be demonstrated both quantitatively and qualitatively. Parallels can be drawn between the activity provided and current research in the energy generation harvesting field. While the competitive nature of students may often drive them to want to find the 'best' design, discussion of the efficiency factors which determine overall dye effectiveness does not require indication of the highest efficiency paint. This allows students the freedom to produce devices which generate energy while expressing themselves through artistic paintings.

Figure 11:
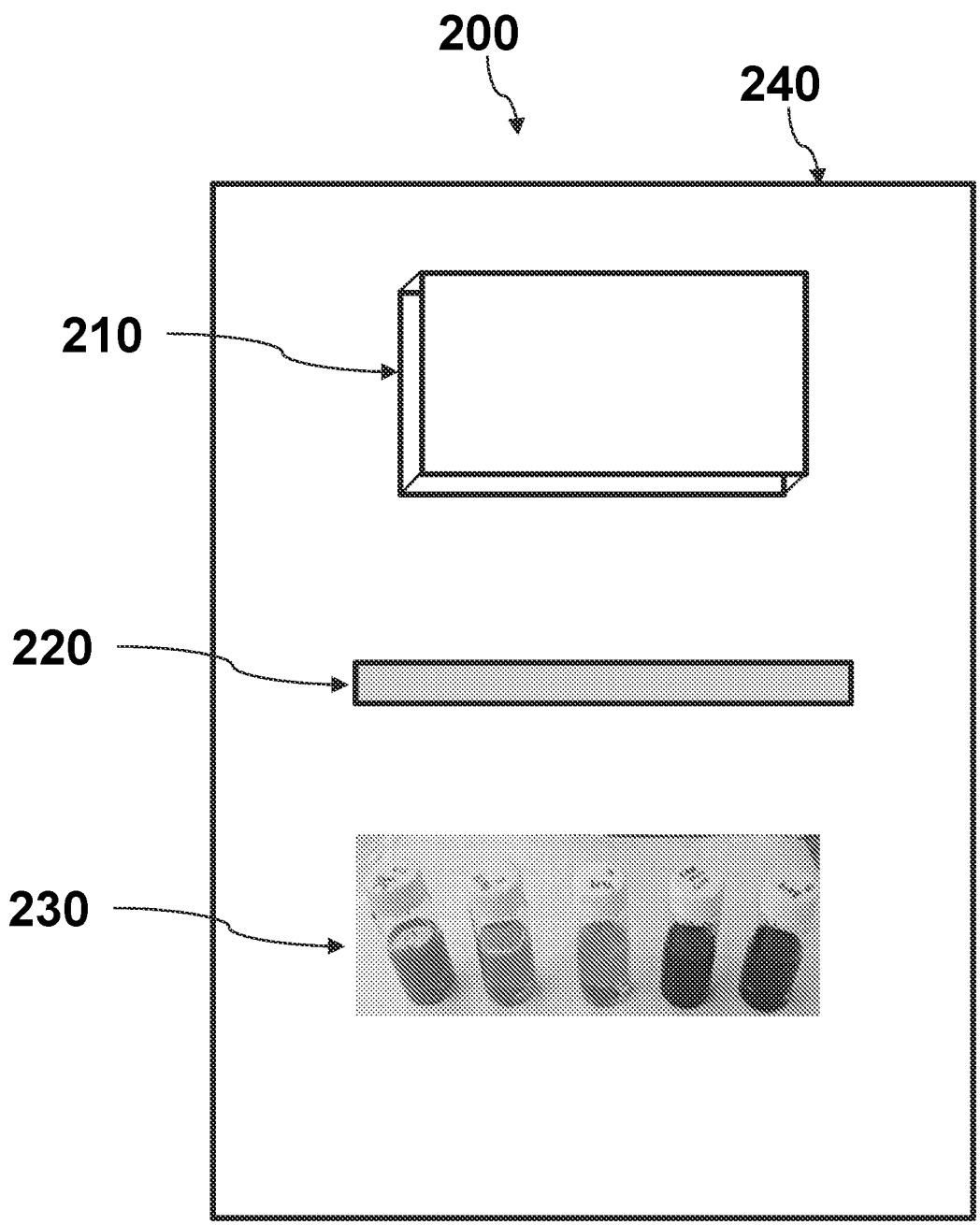
FIG. 11 illustrates a schematic of an educational energy harvesting kit associated with the present disclosure.

Referring to FIG. 11, the present disclosure further provides for an educational energy harvesting kit 200. The kit includes a waveguide 210 formed of a polymer material and operable for trapping at least some light energy, the waveguide defining an edge and a surface; a removable photovoltaic cell 220 adapted to be coupled to the edge of the waveguide, a plurality of waveguide redirecting materials 230 formed of a solidifying colored luminescent paint, the materials are adapted to be applied and adhere to a surface of the waveguide and redirect light energy to the solar photovoltaic cell, and optionally a box 240 enclosure for containing the materials of the kit.

It should be noted that the steps described in the method of use can be carried out in many different orders according to user preference. The use of "step of" should not be interpreted as "step for", in the claims herein and is not intended to invoke the provisions of 35 U.S.C. § 112 (f). Upon reading this specification, it should be appreciated that, under appropriate circumstances, considering such issues as design preference, user preferences, marketing preferences, cost, structural requirements, available materials, technological advances, etc., other methods of use arrangements such as, for example, different orders within above-mentioned list, elimination or addition of certain steps, including or excluding certain maintenance steps, etc., may be sufficient.

The embodiments of the disclosure described herein are exemplary and numerous modifications, variations and rearrangements can be readily envisioned to achieve substantially equivalent results, all of which are intended to be embraced within the spirit and scope of the disclosure. Further, the purpose of the foregoing abstract is to enable the U.S. Patent and Trademark Office and the public generally, and especially the scientist, engineers and practitioners in the art who are not familiar with patent or legal terms or phraseology, to determine quickly from a cursory inspection the nature and essence of the technical disclosure of the application.

What is claimed is:

1. An energy harvesting system comprising:
  (a) a waveguide operable for trapping at least some light energy, the waveguide defining a surface and an edge;

(b) a photovoltaic cell coupled to the surface or the edge of the waveguide and configured to receive light energy; and (c) a colored luminescent paint having a combination of at least a first luminophore component and a pigment component;

wherein the colored luminescent paint is configured to: (i) be applied and adhere to the surface of the waveguide, and (ii) redirect light energy to the photovoltaic cell, and wherein the combination of the pigment component and the first luminophore component defines an absorptive color and a luminescent color of the colored luminescent paint, and wherein the absorptive color and the luminescent color of the colored luminescent paint overlap wherein the luminescent paint comprises a solvent selected from the group consisting of acetone, toluene, ethyl acetate, butyl acetate, dimethylformamide, xylene, benzyl alcohol, methylisobutyl ketone, cyclopentanone, dimethyl carbonate, water, and combinations thereof.

2. The system of claim 1, further comprising a plurality of colored luminescent paints, wherein each of the plurality of colored luminescent paints includes a different combination of at least a first luminophore component and a pigment component corresponding to its luminescent paint and the combination defines an absorptive color and a luminescent color that overlap, and each colored luminescent paint defines a visible luminescent color selected from the group consisting of red, green, blue, yellow, orange, indigo, violet, and combinations thereof, and wherein the color of each of the plurality of colored luminescent paints is the same as the corresponding absorptive color after application to the waveguide.

3. The system of claim 1 wherein the absorptive color of the colored luminescent paint and the luminescent color of the colored luminescent paint are the same.

4. The system of claim 1, wherein the pigment component is a second luminophore.

5. The system of claim 4, wherein the pigment component defines: (i) luminescence at a color that is absorbed by the first luminophore; or (ii) luminescence in the near infrared region, wherein the resulting luminescent color of the colored luminescent paint is the same as the absorptive color of colored luminescent paint.

6. The system of claim 1, wherein the colored luminescent paint further includes a plurality of luminescent pigment components to impart a predominate color through luminescence of the colored luminescent paint and impart a visible color of the colored luminescent paint, wherein the predominate color through luminescence and the visible color are visibly the same.

7. The system of claim 1, wherein the colored luminescent paint defines an opacity and includes modifying nanoparticles or microparticles configured to modify the opacity of the luminescent paint from 0 to 100%.

8. The system of claim 1, wherein the waveguide and the colored luminescent paint are configured to generate power from a light source selected from the group consisting of natural solar light, artificial light, ultraviolet light and combinations thereof.

9. The system of claim 1, wherein the colored luminescent paint is a blue luminescent paint having a blue luminescent dye and a red absorbing dye with near-infrared luminescence, and a polymer host, wherein the blue luminescent paint is visibly blue and emits a visible blue luminescent color after application on the waveguide and when illuminated by a light source.

10. The system of claim 1, wherein the colored luminescent paint is a red luminescent paint having a member selected from the group consisting of: (i) a green absorbing dye with red luminescence and a blue absorbing dye with red luminescence, and (ii) a green absorbing dye with red luminescence and a blue absorbing dye with near-infrared luminescence, wherein the red luminescent paint is visibly red and emits a visible red luminescent color after application on the waveguide and when illuminated by a light source.

11. The system of claim 1, wherein the plurality of colored luminescent paint includes yellow luminescent paint having a member selected from the group consisting of (i) a blue absorbing dye with yellow luminescence and a green absorbing dye with yellow luminescence, and a polymer host, and (ii) a blue absorbing dye with green luminescence and a green absorbing dye with yellow luminescence, and a polymer host, wherein the yellow luminescent paint is visibly yellow and emits a visible yellow luminescent color after application on the waveguide and when illuminated by a light source.

12. The system of claim 1, wherein the colored luminescent paint is formed according to a process of dissolving the combination of the pigment component and the first luminophore component into a solvent solution and then combining with a polymer resin based polymer matrix solution; wherein the colored luminescent paint is configured to adhere to the waveguide and solidify within one hour of application.

13. The system of claim 1, the colored luminescent paint includes a luminescent pigment with a luminescent efficiency of greater than 50% at at least one exciting wavelength.

14. A luminescent solar concentrator device comprising a system of claim 1 having an artistic rendering on the surface of the waveguide provided by application of the colored luminescent paint and coupled to a photovoltaic cell to generate electricity when exposed to a light source.

15. The system of claim 1, wherein the first luminophore component and the pigment component are not the same.

16. An educational energy harvesting kit comprising:
(a) a waveguide formed of a polymer material and operable for trapping at least some light energy, the waveguide defining a surface and an edge;
(b) a removable photovoltaic cell adapted to be coupled to a surface or edge of the waveguide; and
(c) a plurality of colored luminescent paints,
wherein the plurality of colored luminescent paints are each configured to be applied and adhere to a surface of the waveguide and redirect light energy to the solar photovoltaic cell, and
wherein each of the plurality of colored luminescent paints include a combination of a pigment component and at least a first luminophore component and the combination of the pigment component and the first luminophore component defines an absorptive color of the colored luminescent paint and a luminescent color of the colored luminescent paint that are the same wherein the plurality of colored luminescent paints each comprise a solvent selected from the group consisting of acetone, toluene, ethyl acetate, butyl acetate, dimethylformamide, xylene, benzyl alcohol, methylisobutyl ketone, cyclopentanone, dimethyl carbonate, water, and combinations thereof.

17. The educational energy harvesting kit according to claim 16, wherein each of the plurality of colored luminescent paints defines a visible luminescent color selected from the group consisting of red, green, blue, yellow, orange, indigo, violet, and combinations thereof, and wherein the luminescent color of each of the plurality of colored luminescent paints is the same as the corresponding absorptive color of the colored luminescent paint after application to the waveguide.

18. The educational energy harvesting kit according to claim 16, wherein the pigment component is a second luminophore.

19. The educational energy harvesting kit according to claim 18, wherein the pigment component defines luminescence at a color that is absorbed by the at least a first luminophore or luminescence in the near infrared region resulting in the luminescent color of the colored luminescent paint to be the same as the absorptive color of the colored luminescent paint.

20. An energy harvesting system comprising:
(a) a waveguide operable for trapping at least some light energy, the waveguide defining a surface and an edge;
(b) a photovoltaic cell coupled to the surface or the edge of the waveguide and configured to receive light energy; and
(c) a colored luminescent paint having a combination of at least a first luminophore component and a pigment component;

wherein the colored luminescent paint is configured to: (i) be applied and adhere to the surface of the waveguide, and (ii) redirect light energy to the photovoltaic cell, and wherein the combination of the pigment component and the first luminophore component defines an absorptive color and a luminescent color of the colored luminescent paint, and the absorptive color and the luminescent color of the colored luminescent paint overlap; and wherein the colored luminescent paint comprises a dye solution and an acrylic resin solution, wherein the dye solution is in a ratio between 1:2 to 2:1 to the acrylic resin solution.

* * * * *